United States Patent [19]

Otsuka et al.

[11] Patent Number: 4,630,095
[45] Date of Patent: Dec. 16, 1986

[54] PACKAGED SEMICONDUCTOR DEVICE STRUCTURE INCLUDING GETTER MATERIAL FOR DECREASING GAS FROM A PROTECTIVE ORGANIC COVERING

[75] Inventors: Kanji Otsuka, Higashiyamato; Kunizou Sahara, Kodaira; Masao Sekibata, Kunitachi; Kazumichi Mitsusada, Kodaira; Katsumi Ogiue, Tokyo, all of Japan

[73] Assignee: VLSI Technology Research Association, Kanagawa, Japan

[21] Appl. No.: 626,200

[22] Filed: Jun. 29, 1984

Related U.S. Application Data

[63] Continuation of Ser. No. 248,827, Mar. 30, 1984, abandoned.

[30] Foreign Application Priority Data

Mar. 31, 1980 [JP] Japan .................... 55-40505

[51] Int. Cl.⁴ ............... H01L 23/10; H01L 23/04; H01L 23/16; H01L 23/30
[52] U.S. Cl. ........................... 357/78; 357/84; 357/74; 357/73; 357/72
[58] Field of Search ............ 357/84, 78, 73, 85, 357/72, 68

[56] References Cited

U.S. PATENT DOCUMENTS 2,686,279  8/1954  Barton .................... 357/78
4,427,992  1/1984  Ritchie et al. ............ 357/78

FOREIGN PATENT DOCUMENTS 0058469  5/1977  Japan .................... 357/73
0130149  10/1980  Japan .................... 357/84

OTHER PUBLICATIONS

"Dynamic Memories Racked by Radiation"-Electronics Jun., 1978, pp. 42-43.
"Getter to Prevent Corrosion"-Goldman-IBM Technical Disclosure-vol. 17, No. 10, 3-1975, p. 2879.
"Planar Multilevel Interconnection Technology Employing a Polyimide"-Mukai et al-IEEE Journal of Solid-State Circuits-Aug. 1978, pp. 462-467.

Primary Examiner—William D. Larkins
Assistant Examiner—S. V. Clark
Attorney, Agent, or Firm—Antonelli, Terry & Wands

[57] ABSTRACT

A packaged semiconductor device structure includes a semiconductor chip with an organic material covering thereon. The semiconductor chip is placed in a package and hermetically sealed with a low melting point glass. The organic covering serve to suppress undesirable influence on the semiconductor chip by α-rays which may be radiated from the package, and a getter material is placed in the package for decreasing undesirable gases in the package which may be emitted by the organic covering during the sealing process.

11 Claims, 8 Drawing Figures

PACKAGED SEMICONDUCTOR DEVICE STRUCTURE INCLUDING GETTER MATERIAL FOR DECREASING GAS FROM A PROTECTIVE ORGANIC COVERING

This is a continuation of application Ser. No. 248,827, filed Mar. 30, 1984, abandoned.

BACKGROUND OF THE INVENTION

The present invention relates to a packaged semiconductor device structure in which a semiconductor chip including semiconductor devices such as those having a memory function is packaged in a sealed fashion.

Usually, a semiconductor chip is sealed in a package made of a ceramic, glass or plastic (resin).

It is known that when a semiconductor chip including a memory circuit such as a CCD (charge coupled device) memory circuit, a one-MOS dynamic memory circuit or a static memory circuit is sealed in such a package, malfunction of the memory circuit occurs because of adverse effects of the package. More particularly, the package emits alpha ($\alpha$) particles or alpha ($\alpha$)-rays which cause the memory circuit to malfunction.

It has been proposed in U.S. patent application Ser. No. 92,502 (filed on Nov. 8, 1979 and corresponding to DOS No. 2946801 laid open on May 22, 1980) filed on the basis of Japanese Patent Application No. 142375/78 in the name of Hitachi, Ltd., to coat the surface of the semiconductor chip to be sealed in a package with a film of an organic material which emits less alpha particles, such as a polyimide resin in order to prevent the malfunction of the memory circuit due to the alpha particles.

The inventors of the present invention have found that the packaged semiconductor device structure processed in the manner described above has the following disadvantages.

The organic material film is decomposed to produce moisture and/or gas such as $CO_2$ gas at a temperature which occurs when the semiconductor chip is packaged. The moisture especially erodes a low resistance aluminum metalization layer formed inexpensively on the semiconductor chip. The polyimide organic material film can endure temperatures up to approximately 380° C. Accordingly, when the semiconductor chip is packaged at a temperature higher than 380° C., the organic material film will be decomposed and the problem discussed above is encountered.

In order to package the semiconductor chip at a packaging temperature lower than 380° C., sealing with a Au-Sn eutetic alloy brazing material or seam welding may be used. However, when such a sealing method is to be used, sealing portions of the packaged structure must have metallic material. More particularly, a laminated ceramic package is required to have ceramic package members having a metallic material coupled or adhered to their joining or sealing surfaces. Further, it has been found that with such a laminated ceramic package (1) the cost of packaging material is one order of magnitude more expensive than that of other packaging material, and (2) working cost for mounting the semiconductor chip in the package is high.

As an approach to reduction of the packaging cost, use of a structure sealed with a low melting point glass (including no less than 60% by weight PbO) may be considered. In this method, less expensive glass than Au-Sn used in the laminated ceramic pacakge can be used, and the metallization of the sealing portion of the package is not required. Accordingly, the cost can be substantially reduced. However, the glass melts at a temperature of approximately 400°–450° C. The sealing temperature, therefore, should be about 410°–460° C. As a result, in spite of the advantage of cost reduction, this method may degrade the device performance by the erosion of the aluminum metallization by the decomposition of the organic material coating on the semiconductor chip as discussed above.

The inventors have further found that the use of a low melting point glass for sealing or joining the package members requiring such a high sealing temperature as mentioned above causes a substantial increase of the gas pressure within the package due to the above-mentioned gases produced by the organic material film on a semiconductor chip, and that the low melting point glass is very likely to be deformed by the gas pressure increase thereby to reduce the mechanical strength of the sealing.

SUMMARY OF THE INVENTION

It is an object of the present invention to provide a packaged semiconductor device structure in which a semiconductor chip having a memory circuit is packaged.

It is another object of the present invention to provide an inexpensive packaged semiconductor device structure in which a semiconductor chip having a memory circuit is packaged.

In order to attain the above objects, a basic structure according to an aspect of the present invention comprises a packaged semiconductor device structure having a semiconductor chip hermetically sealed in an insulating package with a low melting point glass, wherein the semiconductor chip may, for example, include a memory circuit, an organic material covering is formed on at least a part of the surface of the semiconductor chip and a getter material is disposed in the insulating package to adsorb gases present in the package.

DESCRIPTION OF THE PREFERRED EMBODIMENTS

Figure 1:
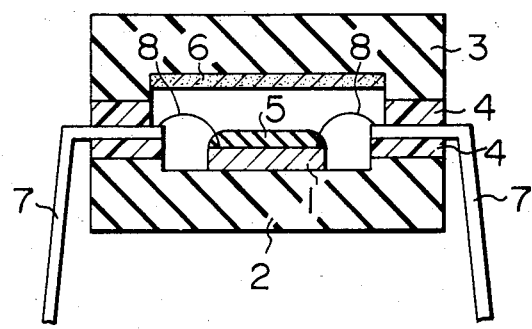
FIG. 1 is a sectional view of a packaged semiconductor device structure in accordance with one embodiment of the present invention.

FIG. 1 is a sectional view of one embodiment of the packaged semiconductor device structure of the present invention, in which numeral 1 denotes a semiconductor chip which includes a CCD memory circuit, a one-MOS dynamic memoy circuit or a static memory circuit. More particularly, it may be a semiconductor chip including a 64K-bit one-MOS dynamic RAM (random access memory). The semiconductor chip 1 is fixed to an inner surface of a base portion 2 of a ceramic package (including no less than 90% by weight of $Al_2O_3$). A cap portion 3 of the ceramic package is fixedly coupled to the base portion 2 with a $PbO-B_2O_3$ (including no less than 60% by weight of PbO) low melting point glass 4 to hermetically seal the semiconductor chip 1 in the package. Numeral 5 denotes a polyimide organic material covering which generates only a small amount of alpha paticles, such as polyimide resin covering or polyimide-isoindolo-quinazolinedione plastic covering. The thickness of the organic material covering 5 should be 10 microns or more. It must be thick enough to prevent the alpha particles emitted from the cap portion 3 from reaching the surface of the semiconductor chip 1 (of e.g. Si). A preferred thickness of the organic material covering 5 after the sealing is 60–100 microns. Numeral 6 denotes a getter material which is deposited on the surface of the cap portion 3 in the package in order to prevent the erosion of aluminum metallization layer and/or the increase of the gas pressure within the package. It mmay be a sintered product of alumina gel (e.g., desiccant PD-08), trademark owened by Owens-Illinois Glass Co., Toledo, Ohio), alumina-silicate gel, silica gel or Vycor glass (trademark owened by Corning Glass Works, Corning, N.Y.) which is a high silicate glass. The getter material is in the form of granules or powder consisting of particles which have voids or open spaces close to a molecular diameter of $H_2O$, $CO_2$, $O_2$, or $N_2$. In order to absorb $H_2O$ which is particularly harmful in this case, the getter material described above is preferably chosen. Calcium oxide may be used as a getter material for adsorbing $CO_2$ and $H_2O$. Further, phosphoric anhydride may be used as a $H_2O$ getter material.

Numeral 7 denotes lead members, which are assembled in the package in the form of a lead frame, which are surrounded by the low melting point glass 4 between the joining or sealing portions of the cap and base portions with the first ends thereof extending into the package and with the second ends thereof extending externally of the package. The lead frame, after having been sealed, is cut out at its extremity, where the external ends of the lead members were united, to form separate lead members. Numeral 8 denotes wires of gold or the like which is bonded to interconnect the electrodes of the semiconductor devices formed on the semiconductor chip 1 and the leads. The semiconductor devices described above are formed in the manner shown in a perspective view of FIG. 2.

Figure 2:
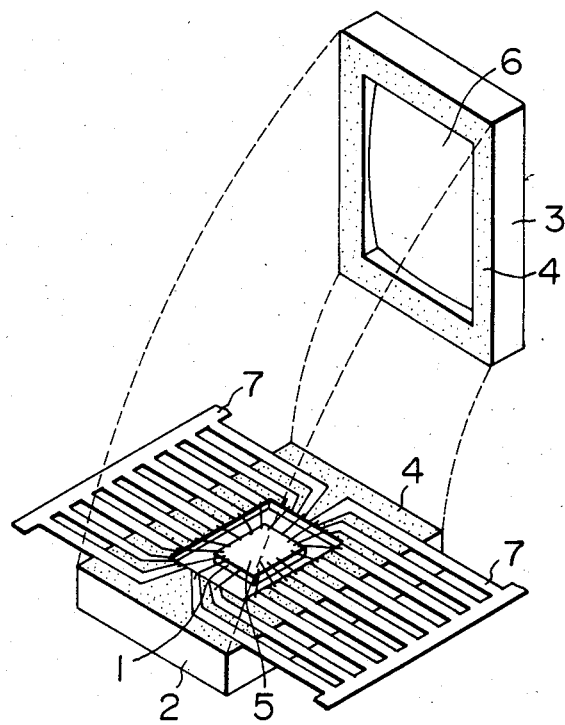
FIG. 2 shows an assembling stage for the structure of the one embodiment of the present invention.

In FIG. 2, the lead members 7 are adhered to the base portion 2 through the low melting point glass 4. After the semiconductor chip 1 is mounted on the base portion, wires 8 are bonded to electrically connect the lead members with the semiconductor chip 1 and the organic material covering 5 is formed on the semiconductor chip 1. Then, the cap portion 3 with the getter material 6 applied thereto and with the low melting point glass 4 applied to its joining surface is mated with the base portion 4 with the joining surfaces of the portions 2 and 3 overlapped. By heating the thus obtained assembly to melt the low melting point glass 4 the cap and base portions are hermetically sealed with each other to form the packaged semiconductor device structure as shown, e.g., in FIG. 1.

In accordance with the structure of the illustrated embodiment, the lead frame is sandwiched by the upper and lower package members, that is, the ceramic base portion and the ceramic cap portion and sealed by the low melting point glass. Thus, since the Au-Sn eutectic alloy brazing material is not used and the laminated ceramic plate base is not used, the structure can be assembled very inexpensively.

Figure 3:
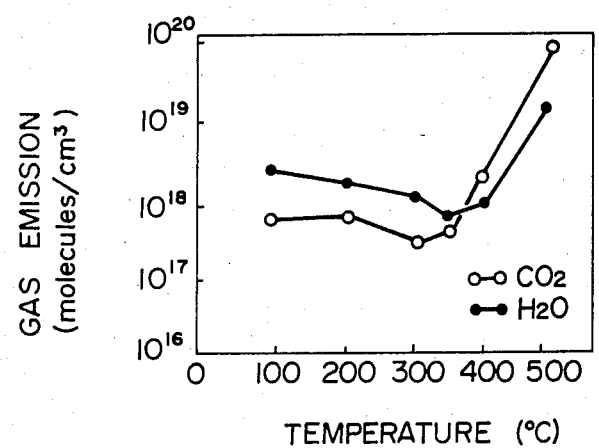
FIG. 3 shows a graph illustrating a relationship between the amount of gas emitted by an organic material and temperature.

Furthermore, despite the presence of the organic material covering on the semeconductor chip 1, the aluminum bonding pads or metallization layer in the semiconductor chip is not eroded at the temperature of the glass sealing. The low melting point glass used to seal the package has a sealing temperature of 410° C. at its lowest point. A low melting point glass which melts at about 450° C. is preferable. In order to reflow the low melting point glass to complete the sealing work, heating at about 410°–460° C. for approximately 10 minutes is required. In this step, the organic material covering formed on the semiconductor chip 1 to block the alpha particles emitted from the cap portion 3 of the package decomposes and produces gas. An experiment by the inventors of the present invention has proved that with the polyimide-isoindolo-quinazolinedione resin, which is one of the organic material coverings described above, the amount of gas produced, such as $H_2O$ or $CO_2$ sharply increases at 400° C. or higher, as shown in FIG. 3. It has been found by the present inventors that the $H_2O$ content of the gas erodes the metallization layer, which in turn degrades the semiconductor device performance. The getter material serves to "getter" not only $H_2O$ and $CO_2$ produced by the organic material covering but also $O_2$ and $N_2$ present in the space within the package, so that the gas pressure within the package can be prevented from being increased. This fact leads to effective avoidance of the lowering of the mechanical strength of sealing for the package.

In accordance with the present invention, by the presence of the getter material in the package, the amount of water vapor ($H_2O$) appearing in the space of the package is materially reduced in comparison with the case where no getter material is used. In case of the absence of the getter material, the amount of water vapor remaining in the space of the package is approximately 3,000–8,000 ppm. When the getter material (e.g. desiccant PD-08 of Owens-Illinois Glass Co., which adsorbs 18% by weight of water vapor) is present as in the embodiment described above, the amount of water vapor in the package decreases to approximately 500 ppm or less. This means that a highly reliable semiconductor device which meets the U.S. MIL specification (no more than 500 ppm) is provided.

The present invention is not limited to the embodiment described above, but it basically calls for the package to be hermetically sealed with a low melting point glass, for the organic material covering to be formed on at least a part of the surface of the semiconductor chip to prevent bad influences on the devices of the semiconductor chip by the alpha particles emitted from the insulating package, and for the getter material to be disposed within the package.

So far as the above requirements are met, the following modifications are possible.

Figure 4:
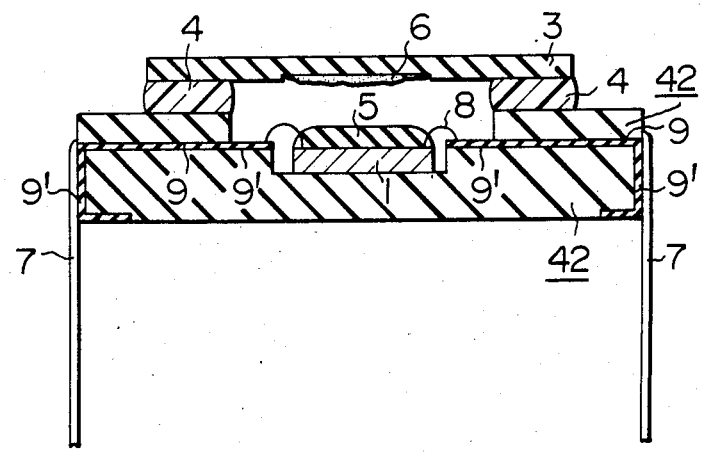
FIGS. 4 and 8 are sectional views of packaged semiconductor device structures in accordance with other embodiments of the present invention.

As shown in FIG. 4, the packaged semiconductor device structure may have a base portion 42 of a laminated ceramic plate which includes, for example, two ceramic plates and metallization layers sandwiched therebetween. In FIG. 4, numeral 1 denotes a semiconductor chip including, for example, a memory circuit, a surface of which is covered with an organic material covering 5 as in the case of the previous embodiment.

The semiconductor chip 1 is supported on the base portion 42 of the laminated ceramic plate. Numeral 3 denotes a cap portion made of a ceramic which is fixed to the top of the base portion 2 by a low melting point glass 4 to hermetically seal the semiconductor chip 1 in the package. A getter material 6 is disposed on a portion of the inner surface of the cap portion 3 as in the case of the previous embodiment. Numerals 9 denote the metallization layers made of, for example, Mo having those portions 9' of its surface to which wires 8 and leads 7 are connected is plated with Au.

The cap portion 3 and the base portion 2 in the packaged semiconductor device structure shown in FIG. 1 may be made of an epoxy resin or a glass having a higher melting point than the low melting point glass 4.

Figure 5:
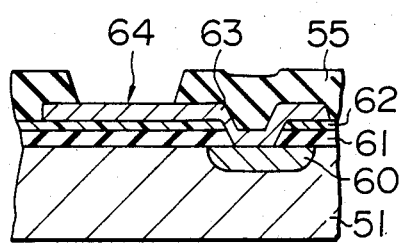
FIGS. 5 and 6 are fragmentary sectional views of semiconductor chips of modified structure to be packaged.
Figure 6:
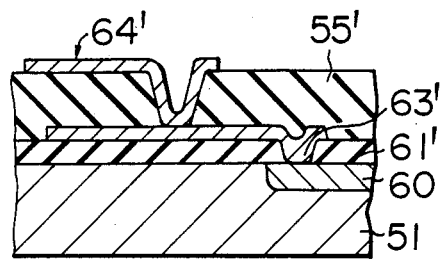
Figure 7:
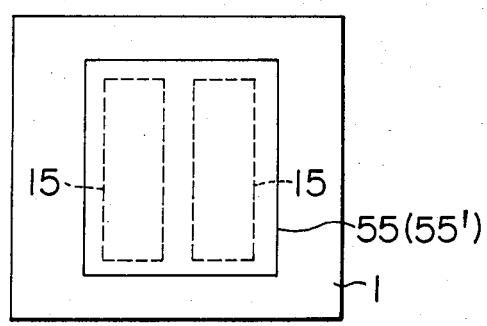
FIG. 7 is a plan view of another semiconductor chip to be packaged.

In the packaged semiconductor device structures shown in FIGS. 1 and 4, the organic material covering is formed on the semiconductor chip 1 after the wire bonding. Alternatively, it may be formed prior to the wire bonding as shown in FIG. 5 or 6. In FIGS. 5 and 6, numeral 60 denotes a semiconductor region formed in a substrate 51 and having an opposite conductivity type to that of the substrate 51 which forms a portion of the memory circuit, numeral 61 (61') denotes an oxide film such as $SiO_2$ film covering the surface of the substrate 51 except the region 60, numeral 62 denotes a phosphosilicate glass film formed on the film 62, numeral 63 (63') denotes an aluminum metallization layer for electrical connection to the region 60 and numeral 64 (64') denotes an aluminum bonding pad in electrical contact with the metallization layer 63 (63'). Numeral 55 (55') denotes an organic material covering. The organic material covering 55 (55') may be formed only on a part of the device which is attacked by the alpha particles, e.g., only on active regions 15, as shown in FIG. 7.

Figure 8:
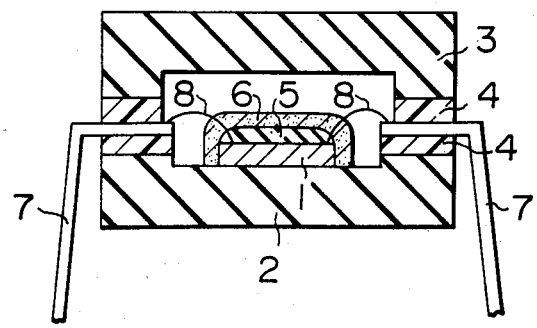

Further as shown in FIG. 8, the getter material 6 may be deposited to cover the semiconductor chip 1 which is coated with the organic material covering 5.

It should be understood that the packaged semiconductor device structure having any combination of the disposition and the kind of the getter material, the material of the package, the material of the sealant for hermetically sealing the package and the disposition and material of the organic material covering for preventing the influence by the alpha particles (alpha rays), described in connection with the embodiments of the present invention constitutes characteristic features of the present invention.

We claim:

1. A packaged semiconductor device structure comprising:
  a ceramic base portion having lower and upper surfaces;
  a semiconductor chip fixed on a first area of said upper surface of the base portion and having a memory circuit;
  an organic shielding material formed on at least a part of the surface of said semiconductor chip for shielding the semiconductor chip from alpha-particles radiated from said ceramic cap portion; and
  a ceramic cap portion having lower and upper surfaces and hermetically connected at an area of its lower surface to a second area of the upper surface of the base portion with a low melting point glass material, said second area surrounding said first area, said ceramic cap and base portions forming a hollow space in which said semiconductor chip is located, the hermetic connection being formed at a temperature at which the organic material can decompose and produce a gas, whereby the gas pressure in the hollow space can increase to thereby lower the mechanical strength of the connection and adversely affect metallization connections of the semiconductor chip;
  wherein a getter material is disposed in said hollow space at a portion of said hollow space surrounding said semiconductor chip covered with said organic shielding material, for gettering said gas produced in said portion of the hollow space by said organic shielding material at a temperature which occurs when the cap portion is connected to the base portion with said low melting point glass material, thereby preventing increase of gas pressure in the hollow space and the resultant lowering of the mechanical strength of the connection, and thereby preventing an adverse effect on the metallization connections of the semiconductor chip due to said gas.

2. A packaged semiconductor device structure according to claim 1, wherein said memory circuit is a CCD memory circuit.

3. A packaged semiconductor device structure according to claim 1, wherein said organic shielding material has a thickness not less than 10 $\mu$m.

4. A packaged semiconductor device structure according to claim 1, wherein said getter material includes at least one material selected from the group consisting of an alumina gel, an aluminasilicate gel, a silica gel and a high silicate glass.

5. A packaged semiconductor device structure according to claim 1, wherein said organic shielding material is made of a polyimide organic material.

6. A packaged semiconductor device structure according to claim 1, wherein said getter material includes a material in the form of granules or powder the particles of which contain open spaces substantially as small as the molecular diameter of one of $H_2O$, $CO_2$, $O_2$ and $N_2$.

7. A packaged semiconductor device structure according to claim 1, wherein said organic shielding material covers only active regions of said semiconductor chip.

8. A packaged semiconductor device structure according to claim 1, wherein said organic shielding material covers an entire upper surface of said semiconductor chip.

9. A packaged semiconductor device structure according to claim 1, wherein said low melting point glass has a melting temperature between 410° C. and 460° C.

10. A packaged semiconductor device structure according to claim 1, wherein said memory circuit is a one-MOS dynamic memory circuit.

11. A packaged semiconductor device structure according to claim 1, wherein said memory circuits is a static circuit.

* * * * *